(12) United States Patent
Ichikawa et al.

(10) Patent No.: US 10,449,638 B2
(45) Date of Patent: Oct. 22, 2019

(54) SOLDER COMPOSITION AND ELECTRONIC BOARD

(71) Applicant: TAMURA CORPORATION, Tokyo (JP)

(72) Inventors: Daigo Ichikawa, Iruma (JP); Ryo Izumi, Iruma (JP); Mitsuru Iwabuchi, Iruma (JP); Nobuhiro Yamashita, Iruma (JP); Kenta Fukuda, Iruma (JP); Satoshi Okumura, Iruma (JP); Nobuo Tajima, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 283 days.

(21) Appl. No.: 15/471,465

(22) Filed: Mar. 28, 2017

(65) Prior Publication Data

US 2017/0282304 A1  Oct. 5, 2017

(30) Foreign Application Priority Data

Mar. 31, 2016 (JP) .................................. 2016-071264
Mar. 1, 2017 (JP) .................................. 2017-038454

(51) Int. Cl.
*B23K 35/00* (2006.01)
*B23K 35/26* (2006.01)
(Continued)

(52) U.S. Cl.
CPC .......... *B23K 35/262* (2013.01); *B23K 35/025* (2013.01); *B23K 35/362* (2013.01);
(Continued)

(58) Field of Classification Search
CPC ................ B23K 35/262; B23K 35/362; B23K 35/3613; B23K 35/025; H05K 3/3489
See application file for complete search history.

(56) References Cited

U.S. PATENT DOCUMENTS

| 2004/0000355 A1* | 1/2004 | Suga .................... B23K 35/262 148/25 |
| 2007/0102481 A1* | 5/2007 | Kato .................... B23K 1/0016 228/101 |

(Continued)

FOREIGN PATENT DOCUMENTS

| JP | 2005-288490 A | 10/2005 |
| JP | 2009-542019 | 11/2009 |

(Continued)

OTHER PUBLICATIONS

Katritzky et al., "Prediction of liquid viscosity for organic compounds by a quantitative structure-property relationship", J. Phys. Org. Chem. vol. 13 (2000), p. 82. 80-86 (Year: 2000).*

(Continued)

*Primary Examiner* — Jie Yang
(74) *Attorney, Agent, or Firm* — Rankin, Hill & Clark LLP

(57) ABSTRACT

A solder composition of the invention includes: a flux composition containing a component (A) in a form of a rosin-based resin, a component (B) in a form of an activator, a component (C) in a form of a solvent and a component (D) in a form of a thixotropic agent; and a component (E) in a form of a solder powder. The component (C) in a form of the solvent contains a component (C1) in a form of a isobornyl cyclohexanol and a component (C2) in a form of a solvent whose viscosity at 20 degrees C. is 10 mPa·s or less and whose boiling point ranges from 220 degrees C. to 245 degrees C.

3 Claims, 3 Drawing Sheets

(51) Int. Cl.
*B23K 35/02* (2006.01)
*B23K 35/36* (2006.01)
*B23K 35/362* (2006.01)
*H05K 3/34* (2006.01)
*B23K 101/42* (2006.01)

(52) U.S. Cl.
CPC ...... *B23K 35/3613* (2013.01); *B23K 35/3617* (2013.01); *H05K 3/3463* (2013.01); *B23K 2101/42* (2018.08); *H05K 3/3489* (2013.01); *H05K 3/3494* (2013.01); *H05K 2203/107* (2013.01)

(56) References Cited

U.S. PATENT DOCUMENTS

2008/0000549 A1* 1/2008 Sheng .................. B23K 35/025 148/23

2015/0028085 A1* 1/2015 Endoh .................. B22F 1/0018 228/224
2019/0051807 A1* 2/2019 Okumura ................ H01L 35/08

FOREIGN PATENT DOCUMENTS

| | | | |
|---|---|---|---|
| JP | 2014-100737 A | 6/2014 | |
| JP | 2014-117745 A | 6/2014 | |
| JP | 5756067 | 6/2015 | |
| JP | 2015-142936 A | 8/2015 | |
| JP | 2017098282 A * | 6/2017 | ............. H01L 35/08 |
| WO | 2004/108345 A1 | 12/2004 | |
| WO | 2008/000349 | 1/2008 | |

OTHER PUBLICATIONS

Japanese Notice of Allowance with English translation dated Aug. 28, 2018, 2 pages.
Japanese Office Action with English translation dated Jun. 19, 2018, 3 pages.

* cited by examiner

SOLDER COMPOSITION AND ELECTRONIC BOARD

The entire disclosure of Japanese Patent Application No. 2016-071264 filed Mar. 31, 2016 and Japanese Patent Application No. 2017-038454 filed Mar. 1, 2017 is expressly incorporated by reference herein.

TECHNICAL FIELD

The present invention relates to a solder composition and an electronic board.

BACKGROUND ART

A solder composition is a mixture in a form of a paste obtained by kneading a solder powder and a flux composition (i.e. a composition including a rosin-based resin, an activator, a solvent and the like) (see, for instance, Patent Literature 1: Japanese Patent No. 5756067). The solder composition is required to exhibit restraining effect of a generation of voids and excellent printability, as well as solderability such as solder melting property and a property of easily being wet and spread (i.e. solder wet-spreadability).

On the other hand, recent diversification of functions of electronic devices requires a large-sized electronic component to be installed on an electronic board. Further, some of the large-sized electronic components (e.g. power transistors) have a wide area of electrode terminals. Since the solder composition is printed over a large print area in such an electronic component, large-diameter voids are likely to be generated.

It has been studied to use a highly viscous solvent with a high boiling point (e.g. isobornyl cyclohexanol) in a solder composition in order to reduce the large-diameter voids. However, it is found that the use of such a highly viscous solvent with a high boiling point is not effective for reducing the large-diameter voids when the solder composition is applied to electronic components such as a power transistor having an electrode terminal with a large area.

SUMMARY OF THE INVENTION

An object of the invention is to provide a solder composition that is capable of sufficiently restraining generation of large-diameter voids even when the solder composition is printed over a large print area and is capable of exhibiting sufficient printability, and to provide an electronic board using the solder composition.

To solve the above problem, the present invention provides a solder composition and an electronic board described hereinbelow.

A solder composition according to an aspect of the invention includes: a flux composition containing a component (A) in a form of a rosin-based resin, a component (B) in a form of an activator, a component (C) in a form of a solvent and a component (D) in a form of a thixotropic agent; and a component (E) in a form of a solder powder. The component (C) in a form of the solvent contains a component (C1) in a form of a isobornyl cyclohexanol and a component (C2) in a form of a solvent whose viscosity at 20 degrees C. is 10 mPa·s or less and whose boiling point ranges from 220 degrees C. to 245 degrees C.

In the solder composition according to the above aspect of the invention, it is preferable that the component (C) further includes a component (C3) in a form of a solvent whose boiling point ranges from 255 degrees C. to 300 degrees C.

In the solder composition according to the above aspect of the invention, it is preferable that the component (C3) in a form of the solvent whose boiling point ranges from 255 degrees C. to 300 degrees C. has a viscosity at 20 degrees C. of 10 mPa·s or less.

An electronic board according to another aspect of the invention includes a soldered portion using the solder composition according to the above aspect of the invention.

Though it is not known why the solder composition of the above aspect of the invention sufficiently restrain the generation of large-diameter voids and exhibits sufficient printability even when the solder composition is printed over a large print area, the inventors of the invention speculate the reason therefor as follows.

Specifically, the solder composition of the above aspect of the invention uses (C1) isobornyl cyclohexanol as the component (C) (the solvent). Since the component (C1) has a high boiling point, the component (C1) hardly volatilizes before the solder melts. Accordingly, the generation of voids due to evaporation of the solvent is preventable. In addition, since the component (C1) is highly viscous, a phenomenon in which the solder composition flows off the target portion when being heated (shear drop by heating) can be restrained. Furthermore, since the solder composition containing the component (C1) has a certain degree of fluidity when being melted, the gas in the solder composition can gradually gather to be released to an outside. However, when the solder composition is printed over a large print area, since the fluidity of the solder composition is insufficient, the gas in the solder composition cannot be fully released to the outside when the solder composition is melted, resulting in a large-diameter void. The inventors speculate that the above mechanism causes the large-diameter void when the solder composition containing the component (C1) is printed over a large print area.

In view of the above, the component (C) in a form of the solvent of the solder composition of the above aspect of the invention also includes the component (C2) in a form of a solvent whose viscosity at 20 degrees C. is 10 mPa·s or less and whose boiling point ranges from 220 degrees C. to 245 degrees C., in addition to as the component (C1). Since the component (C2) has a low viscosity, the fluidity of the solder composition during a preheating process can be improved and the gas in the solder composition becomes easily removable. In addition, since the component (C2) has a relatively low boiling point, the component (C2) volatilizes to be gasified before the solder is melted and the generated gas pushes the gas in the solder composition to the outside. As a result, the combined use of the components (C1) and (C2) sufficiently restrains the generation of the large-diameter voids when the solder composition is printed over a large print area. The inventors speculate the advantages of the above aspect of the invention are achieved as discussed above.

According to the above aspect of the invention, a solder composition that is capable of sufficiently restraining generation of large-sized voids even when the solder composition is printed over a large print area and is capable of exhibiting sufficient printability, and an electronic board using the solder composition can be provided.

BRIEF DESCRIPTION OF DRAWING(S)

DESCRIPTION OF EMBODIMENT(S)

Figure 1:
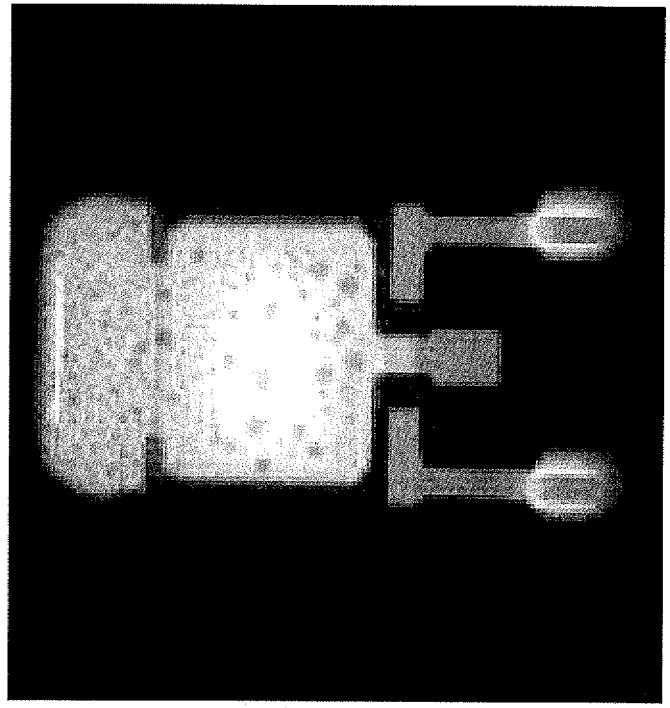
FIG. 1 is a photograph showing an image of a solder-joint portion on a test board of Example 1 observed using an X-ray inspection machine.

A solder composition of an exemplary embodiment of the invention includes a flux composition and a component (E) in a form of a solder powder respectively described hereinbelow.

Flux Composition

Initially, a flux composition for use in the exemplary embodiment will be described. The flux composition for use in the exemplary embodiment is a component other than the solder powder in the solder composition, and includes a component (A) in a form of a rosin-based resin, a component (B) in a form of an activator, a component (C) in a form of a solvent and a component (D) in a form of a thixotropic agent.

Component (A)

Examples of the component (A) (the rosin-based resin) for use in the exemplary embodiment include rosins and rosin-based modified resins. Examples of the rosins include gum rosin, wood rosin, tall oil rosin, disproportionated rosin, polymerized rosin, hydrogenated rosin, and a derivative thereof. As for the rosin-based modified resin, it is possible to employ an unsaturated-organic-acid-modified resin of the rosins (e.g. modified resin obtained by modification using an aliphatic unsaturated monobasic acid such as (meth)acrylic acid, an aliphatic unsaturated dibasic acid such as $\alpha,\beta$-unsaturated carboxylic acids including fumaric acid and maleic acid, and an aromatic-ring-containing unsaturated carboxylic acid such as cinnamic acid), an abietic-acid-modified resin of the rosins, or a substance containing, as its main component, the modified resin(s). The rosins can be a reaction component of Diels-Alder reaction. The rosin-based resin can be employed singly or in combination of two or more kinds thereof.

A content of the component (A) is preferably in a range from 20 mass % to 60 mass %, more preferably in a range from 25 mass % to 50 mass % with respect to 100 mass % of the flux composition. When the content of the component (A) is less than the lower limit described above, a so-called solderability (prevention of oxidation of a copper foil surface on a soldering land such that melted solder easily gets wet on the copper foil surface) is decreased, and a solder ball is likely to be formed. In contrast, when the content of the component (A) exceeds the upper limit described above, an amount of the flux residue is likely to be increased.

Component (B)

Examples of the component (B) (the activator) include an organic acid, a dissociative activator consisting of a dissociative halogenated compound and an amine activator. The activator can be employed singly or in combination of two or more kinds thereof. Among the above, in terms of environmental effect and corrosion inhibition effect at the soldered portion, the use of the organic acid or (halogen-free) amine activator is preferable, and the use of the organic acid is more preferable.

Examples of the organic acid include mono-carboxylic acid, di-carboxylic acid and other organic acid.

Examples of the monocarboxylic acid include formic acid, acetic acid, proprionic acid, butyric acid, valeric acid, caproic acid, enanthic acid, capric acid, lauryl acid, myristic acid, pentadecyl acid, palmitin acid, margaric acid, stearic acid, tuberculostearic acid, arachidic acid, behenic acid, lignoceric acid and glycolic acid.

Examples of the dicarboxylic acid include oxalic acid, malonic acid, succinic acid, glutaric acid, adipic acid, pimelic acid, suberic acid, azelaic acid, sebacic acid, fumaric acid, maleic acid, tartaric acid and diglycolic acid.

Examples of the other organic acid include dimer acid, levulinic acid, lactic acid, acrylic acid, benzoic acid, salicylic acid, anisic acid, citric acid and picoline acid.

Examples of the dissociative activator include a non-salt organic compound to which a halogen atom is bonded through a covalent bond. The halogenated compound may be a compound in which chlorine atom(s), bromine atom(s) or fluorine atom(s) is singly included through a covalent bond (e.g. a chloride, bromide and fluoride). Alternatively, the halogenated compound may be a compound in which any two or all of atoms selected from chlorine atom(s), bromine atom(s) and fluorine atom(s) are included through a covalent bond. It is preferable, in view of improvement in the solubility to an aqueous solvent, that the halogenated compound has a polar group such as hydroxyl group and carboxyl group (e.g. halogenated alcohol or halogenated carboxyl compound). Examples of the halogenated alcohol include: brominated alcohol such as 2,3-dibromopropanol, 2,3-dibromobutanediol, trans-2,3-dibromo-2-butene-1,4-diol, 1,4-dibromo-2-butanol and tribromoneopentylalcohol; chlorinated alcohol such as 1,3-dichloro-2-propanol and 1,4-dichloro-2-butanol; fluorinated alcohol such as 3-fluorocatechol; and other compounds equivalent to the above. Examples of the halogenated carboxyl compound include: a carboxyl iodide compound such as 2-iodobenzoic acid, 3-iodobenzoic acid, 2-iodopropionic acid, 5-iodosalicylic acid and 5-iodoanthranilic acid; carboxyl chloride compound such as 2-chlorobenzoic acid and 3-chloropropionic acid; a brominated carboxyl compound such as 2,3-dibromopropionic acid, 2,3-dibromosuccinic acid and 2-bromobenzoic acid; and other compounds equivalent to the above.

Examples of the amine activator include amines (e.g. polyamine such as ethylene diamine), amine salts (e.g. organic acid salt or inorganic acid (hydrochloric acid, sulfuric acid, hydrobromic acid and the like) salt of amines including trimethylolamine, cyclohexyl amine and diethyl amine, and amino alcohol), amino acids (glycine, alanine, asparagine acid, glutamic acid, and valine), and amide compounds. Specific examples of the amine activator include diphenyl guanidine hydrobromate, cyclohexyl amine hydrobromate, diethyl amine salts (hydrochloride, succinate, adipate, sebacate and the like), triethanol amine, mono-ethanol amine, and hydrobromate of triethanol amine and mono-ethanol amine.

The total content of the component (B) is preferably in a range from 1 mass % to 20 mass %, more preferably in a range from 1 mass % to 15 mass %, and particularly preferably in a range from 2 mass % to 10 mass % with respect to 100 mass % of the flux composition. When the total content of the component (B) is less than the lower limit described above, a solder ball is likely to be formed. In contrast, when the total content of the component (B) exceeds the upper limit described above, the insulation property of the flux composition is likely to be decreased.

Component (C)

It is necessary for the component (C) (the solvent) used in the exemplary embodiment to include a component (C1) in a form of isobornyl cyclohexanol, and a component (C2) in a form of a solvent whose viscosity at 20 degrees C. is 10 mPa·s or less and whose boiling point ranges from 220 degrees C. to 245 degrees C. The combined use of the components (C1) and (C2) sufficiently restrains the generation of large-diameter voids even when the solder composition is printed over a large print area.

In order to further restrain the generation of voids, it is more preferable that the viscosity of the component (C2) at 20 degrees C. is 8 mPa·s or less, further more preferably 5 mPa·s or less, and especially preferably 2 mPa·s or less. Though the lower limit of the viscosity of the component (C2) at 20 degrees C. is not specifically limited, the viscosity of the component (C2) at 20 degrees C. may be 0.01 mPa·s or more. It should be noted that the viscosity of the solvent is measurable using a Brookfield Viscometer.

Further, in order to further restrain the generation of voids, it is more preferable that the boiling point of the component (C2) is in a range from 225 degrees C. to 245 degrees C., especially preferably in a range from 230 degrees C. to 243 degrees C. It should be noted that the "boiling point" herein refers to a boiling point of a subject component at 1013 hPa.

Examples of the component (C2) include tripropyleneglycol monomethylether (boiling point: 242 degrees C., viscosity: 1 mPa·s), dipropylene glycol monobutylether (boiling point: 231 degrees C., viscosity: 7.4 mPa·s), ethyleneglycol mono-2-ethylhexyl ether (boiling point: 229 degrees C., viscosity: 7.6 mPa·s), diethylene glycol monobutylether (boiling point: 231 degrees C., viscosity: 6.5 mPa·s) and diethylene glycol monoethylether acetate (boiling point: 220 degrees C., viscosity: 2.8 mPa·s). The above compounds can be employed singly or in combination of two or more kinds thereof. It should be noted that the viscosity described in parentheses refers to a viscosity at 20 degrees C.

A mass ratio ((C2)/(C1) of the component (C2) to the component (C1) is preferably in a range from 1/5 to 5, more preferably in a range from 1/3 to 3, further more preferably in a range from 1/2 to 2 and especially preferably in a range from 1/2 to 1 in order to further restrain the generation of voids.

The component (C) preferably further contains a component (C3) in a form of a solvent whose boiling point ranges from 255 degrees C. to 300 degrees C. Due to the presence of the component (C3), the adjustment of the viscosity of the solder composition can be facilitated and the printability and the void restraining effect can be easily balanced.

Further, in order to balance the printability and the void restraining effect, it is more preferable that the boiling point of the component (C3) is in a range from 260 degrees C. to 290 degrees C., especially preferably in a range from 270 degrees C. to 275 degrees C.

It should be noted that, though the viscosity of the component (C3) at 20 degrees C. is not specifically limited, the viscosity of the component (C3) at 20 degrees C. may be, for instance, in a range from 2 mPa·s to 60 mPa·s, in a range from 3 mPa·s to 30 mPa·s, or in a range from 5 mPa·s to 15 mPa·s.

On the other hand, the viscosity of the component (C3) at 20 degrees C. is preferably 10 mPa·s or less, more preferably 5 mPa·s or less. When the upper limit of the viscosity is at or less than the above range, a size increase of the voids caused by a plurality of times of reflow processes can be restrained.

Examples of the component (C3) include benzylglycol (boiling point: 256 degrees C., viscosity: 12.6 mPa·s), diethyleneglycol mono2-ethylhexyl ether (boiling point: 272 degrees C., viscosity: 10.4 mPa·s), tripropyleneglycol (boiling point: 265 degrees C., viscosity: 57.2 mPa·s), diethyleneglycol monobenzylether (boiling point: 302 degrees C., viscosity: 19.3 mPa·s), diethyleneglycol monohexylether (boiling point: 259 degrees C., viscosity: 8.6 mPa·s), tetraethylene glycol dimethyl ether (boiling point: 275 degrees C., viscosity: 3.8 mPa·s), tripropyleneglycol monobutylether (boiling point: 274 degrees C., viscosity: 8.4 mPa·s), dibutyl maleate (boiling point: 281 degrees C., viscosity: 5.0 mPa·s) and diethyleneglycol dibutylether (boiling point: 255 degrees C., viscosity: 2.4 mPa·s). The above compounds can be employed singly or in combination of two or more kinds thereof. It should be noted that the viscosity described in parentheses refers to a viscosity at 20 degrees C. Among the above compounds, in order to restrain the size increase of the voids due to a plurality of the reflow processes, tetraethylene glycol dimethyl ether is especially preferable.

When the component (C3) is used, a mass ratio ((C3)/(C1) of the component (C3) to the component (C1) is preferably in a range from 1/5 to 5, more preferably in a range from 1/3 to 3, further more preferably in a range from 1/2 to 2 and especially preferably in a range from 1/2 to 1 in order to balance the printability and the void restraining effect.

The component (C) may additionally contain a solvent (component (C4)) other than the components (C1), (C2) and (C3) as long as the component (C4) is compatible with an object of the invention.

Examples of the component (C4) include phenyl glycol (boiling point: 245 degrees C., viscosity: 30.5 mPa·s), 2-ethyl-1,3-hexanediol (boiling point: 244 degrees C., viscosity: 320 mPa·s) and dipropylene glycol monophenylether (boiling point: 243 degrees C., viscosity: 23.2 mPa·s). The above compounds can be employed singly or in combination of two or more kinds thereof. It should be noted that the viscosity described in parentheses refers to a viscosity at 20 degrees C.

A content of the component (C) is preferably in a range from 20 mass % to 60 mass %, more preferably in a range from 25 mass % to 55 mass %, and particularly preferably in a range from 30 mass % to 50 mass % with respect to 100 mass % of the flux composition. When the content of the solvent is in the above-described range, a viscosity of the obtained solder composition can be adjusted to be within an appropriate range.

Component (D)

Examples of the component (D) (the thixotropic agent) to be used in the exemplary embodiment include hardened castor oil, amides, kaolin, colloidal silica, organic bentonite and glass frit. The thixotropic agent can be employed singly or in combination of two or more kinds thereof.

A content of the component (D) is preferably in a range from 3 mass % to 20 mass %, more preferably in a range from 5 mass % to 15 mass % with respect to 100 mass % of the flux composition. When the content of the thixotropic agent is less than the lower limit described above, thixotropy cannot be exhibited, and therefore sagging is likely to occur. In contrast, when the content of the thixotropic agent exceeds the upper limit described above, the thixotropy becomes too high, and therefore printing defect is likely to occur.

Other Components

In addition to the above-described component (A), component (B), component (C) and component (D), other additives and other resins may be added as necessary to the flux composition for use in the exemplary embodiment. Examples of the other additives include an antifoaming agent, an antioxidant, a modifier, a delustering agent and a foaming agent. Examples of the other resins include acryl resin.

Solder Composition

Next, the solder composition of the exemplary embodiment will be described hereinbelow. A solder composition of the exemplary embodiment includes the flux composition of the exemplary embodiment and a component (E) (a solder powder) as explained hereinbelow.

A content of the flux composition is preferably in a range from 5 mass % to 35 mass %, more preferably in a range from 7 mass % to 15 mass %, and particularly preferably in a range from 8 mass % to 12 mass % with respect to 100 mass % of the solder composition. When the content of the flux composition is less than 5 mass % (i.e. when the content of the solder powder exceeds 95 mass %), the amount of the flux composition as a binder is insufficient, so that it is likely that the flux composition is not easily mixed with the solder powder. In contrast, when the content of the flux composition exceeds 35 mass % (i.e. when the content of the solder powder is less than 65 mass %), it is likely that sufficient solder joint cannot be formed when the resulting solder composition is used.

Component (E)

Although the component (E) (the solder powder) for use in the exemplary embodiment preferably consists solely of a lead-free solder powder, the solder powder may be a leaded solder powder. As solder alloy in the solder powder, alloy including tin (Sn) as its main component is preferably used. Further, examples of a second element of the alloy include silver (Ag), copper (Cu), zinc (Zn), bismuth (Bi), indium (In) and antimony (Sb). Further, as necessary, other elements (i.e. third and subsequent elements) may be added to the alloy. Examples of the other elements include copper, silver, bismuth, indium, antimony and aluminum (Al).

The lead-free solder powder herein means a powder of solder metal or alloy to which lead is not added. It is to be noted that lead as an unavoidable impurity may be contained in the lead-free solder powder. However, in this case, an amount of the lead is preferably 300 mass ppm or less.

Specific examples of the solder alloy for the lead-free solder powder include Sn—Ag, Sn—Ag—Cu, Sn—Cu, Sn—Ag—Bi, Sn—Bi, Sn—Ag—Cu—Bi, Sn—Sb, Sn—Zn—Bi, Sn—Zn, Sn—Zn—Al, Sn—Ag—Bi—In, Sn—Ag—Cu—Bi—In—Sb and In—Ag. Above all, in view of strength of the solder joint, the solder alloy of Sn—Ag—Cu system is preferably used. A melting point of the solder of Sn—Ag—Cu system is typically in a range from 200 degrees C. to 250 degrees C. Incidentally, among the solder of Sn—Ag—Cu system, a melting point of the solder of a system whose silver content is low is in a range from 210 degrees C. to 250 degrees C. (or in a range from 220 degrees C. to 240 degrees C.).

An average particle diameter of the component (E) is typically in a range from 1 μm to 40 μm, however, in order to be applied on an electronic board in which a pitch of soldering pads is narrow, the average particle diameter of the component (E) is preferably in a range from 1 μm to 35 μm, more preferably in a range from 2 μm to 30 μm, and particularly preferably in a range from 3 μm to 20 μm. It should be noted that the average particle diameter can be measured with a particle-size measurement device using dynamic light scattering.

Manufacturing Method of Solder Composition

The solder composition of this exemplary embodiment can be manufactured by blending the flux composition and the component (E) (the solder powder) respectively described above at the predetermined ratio described above, and stirring and mixing the blended flux composition and the component (E) (the solder powder).

Electronic Board

Next, the electronic board of the exemplary embodiment will be described hereinbelow. An electronic board of the exemplary embodiment includes a soldered portion using the above-described solder composition. The electronic board of the exemplary embodiment is manufacturable by attaching an electronic component on an electronic board (e.g. printed circuit board) using the solder composition.

The solder composition of the exemplary embodiment can sufficiently restrain the generation of large-diameter voids even when the solder composition is printed over a large print area. Accordingly, an electronic component with a large area of electrode terminal(s) (e.g. power transistor) is usable. Further, the print area of the solder composition may be, for instance, 20 mm$^2$ or more, 30 mm$^2$ or more, or 40 mm$^2$ or more. It should be noted that the print area corresponds to an area of the electrode terminal of the electronic component.

Examples of a coating applicator to be used include a screen printer, a metal mask printer, a dispenser and a jet dispenser.

Further, the electronic component can be attached on the electronic board by a reflow process in which the electronic component is placed on the solder composition coated by the coating applicator and heated by a reflow furnace under a predetermined condition, so as to attach the electronic component on the printed circuit board.

In the reflow process, the electronic component is placed on the solder composition and heated by the reflow furnace under a predetermined condition. Through the reflow process, a sufficient solder joint can be formed between the electronic component and the printed circuit board. As a result, it is possible to attach the electronic component on the printed circuit board.

The condition for the reflow process may be appropriately set in accordance with the melting point of the solder. For example, when the solder alloy of Sn—Ag—Cu system is used, the preheating may be performed at a temperature in a range from 150 degrees C. to 200 degrees C. for 60 seconds to 120 seconds and a peak temperature may be set to be in a range from 230 degrees C. to 270 degrees C.

Further, the solder composition and the electronic board of the invention are not limited to the above-described exemplary embodiment, but the invention includes modifications and improvements as long as the modifications and improvements are compatible with an object of the invention.

For example, though the printed circuit board and the electronic component of the electronic board are bonded through the reflow process, the bonding process is not limited thereto. For example, instead of the reflow process, a process in which laser beam is used to heat the solder composition (i.e. laser heating process) may be adopted to join the printed circuit board and the electronic component. In this case, a laser beam source is not particularly limited, but any laser beam source may be used in accordance with a wavelength corresponding to an absorption band of the metal. Examples of the laser beam source include a solid-state laser (e.g. ruby, glass and YAG), a semiconductor laser (e.g. GaAs and InGaAsP), a liquid laser (e.g. pigment and the like), and a gas laser (e.g. He—Ne, Ar, CO$_2$ and excimer).

EXAMPLES

Next, the invention is further described in detail based on Examples and Comparative Examples, however the scope of the invention is by no means limited by the Examples and Comparative Examples. Incidentally, materials used in the Examples and Comparative Examples are as follows.
Component (A)
Rosin-based resin: hydrogenated acid-modified rosin, product name "PINECRYSTAL KE-604", manufactured by Arakawa Chemical Industries, Ltd.
Component (B)
Activator A: malonic acid
Activator B: dibromobutenediol
Component (C1)
Solvent A: isobornyl cyclohexanol
Component (C2)
Solvent B: tripropylene glycol monomethylether (boiling point: 242 degrees C., viscosity: 1 mPa·s)
Solvent C: dipropylene glycol monobutylether (boiling point: 231 degrees C., viscosity: 7.4 mPa·s)
Solvent D: ethylene glycol mono-2-ethylhexyl ether (boiling point: 229 degrees C., viscosity: 7.6 mPa·s)
Component (C3)
Solvent E: diethylene glycol mono-2-ethylhexyl ether (boiling point: 272 degrees C., viscosity: 10.4 mPa·s)
Solvent F: benzyl glycol (boiling point: 256 degrees C., viscosity: 12.6 mPa·s)
Solvent G: diethylene glycol monohexylether (boiling point: 259 degrees C., viscosity: 8.6 mPa·s)
Solvent H: tetraethylene glycol dimethylether (boiling point: 275 degrees C., viscosity: 3.8 mPa·s)
Component (C4)
Solvent I: phenyl glycol (boiling point: 245 degrees C., viscosity: 30.5 mPa·s)
Solvent J: 2-ethyl-1,3-hexanediol (boiling point: 244 degrees C., viscosity: 320 mPa·s)
Component (D)
Thixotropic agent: product name "SLIPAX ZHH", manufactured by Nippon Kasei Chemical Co.
Component (E)
Solder powder: solder powder having alloy composition of Sn-3.0Ag-0.5Cu, particle diameter distribution ranging from 20 μm to 38 μm, and solder melting point ranging from 217 degrees C. to 220 degrees C.

Example 1

42 mass % of rosin-based resin, 2.1 mass % of activator A, 2 mass % of activator B2, 13 mass % of solvent A, 8 mass % of solvent B, 20.9 mass % of solvent E and 12 mass % of thixotropic agent were put into a container and were blended using a planetary mixer to obtain a flux composition.

Thereafter, 10.2 mass % of the obtained flux composition and 89.8 mass % of solder powder (100 mass % in total) were put into a container, and were blended using a planetary mixer to prepare a solder composition.

Examples 2 to 4

Solder compositions were obtained in the same manner as that in Example 1 except that materials were blended in accordance with compositions shown in Table 1.

Comparative Examples 1 to 7

Solder compositions were obtained in the same manner as that in Example 1 except that materials were blended in accordance with compositions shown in Table 1.

Evaluation of Solder Composition

Evaluation of the solder composition (regarding viscosity, printability, void ratio in a power transistor and voids on a bump) was performed by the following procedures. The obtained results are shown in Table 1.

(1) Viscosity

The viscosity was measured as follows using a spiral viscometer. Initially, the solder composition was left still at 25 degrees C. for two to three hours. After opening a lid of a container containing the solder composition, the solder composition was carefully stirred for one to two minutes using a spatula so as to keep the air from being trapped. Further, the container of the solder composition was put into a constant temperature bath. Subsequently, a rotation speed of a rotor was adjusted at 10 rpm, and the temperature of the solder composition was set at 25 degrees C. After it is confirmed that the solder paste sucked by the rotor emerged through a discharge port, the rotation of the rotor was stopped and the rotor was kept stopped until the temperature became constant. After the temperature of the solder composition became constant, the rotation speed of the rotor was adjusted at 10 rpm and a viscosity value η after an elapse of three minutes was read.

(2) Printability

Using a 0.12 mm-thick printing plate provided with forty nine 0.3 mm-diameter through holes and forty nine 0.4 mm-diameter through holes, the solder composition was printed on a board at a printing speed of 50 mm/sec and a printing pressure of 0.2 N. Then, the printing plate after performing the printing was visually checked to measure a ratio of a hole through which the composition penetrates (a ratio of the above hole(s) to all of the through holes (i.e. penetration ratio)) was measured, and the printability was evaluated according to the following criteria.

A: 60% or more of the penetration ratio.
B: the penetration ratio of 40% or more and less than 60%.
C: less than 40% of the penetration ratio.

(3) Void Ratio in Power Transistor

A solder composition was printed on a board having an electrode on which a power transistor (size: 5.5 mm×6.5 mm, thickness: 2.3 mm, land: tin-plated, area of the land: 30 mm$^2$) was installable with use of a metal mask having corresponding patterns. Subsequently, the power transistor was installed on the solder composition and a reflow process (in a nitrogen atmosphere, oxygen concentration 1000 ppm or less) was performed under conditions of 80 seconds of preheating at 150 to 180 degrees C., peak temperature of 240 degrees C. and 40 seconds of melting time to prepare a test board. A solder-joint portion on the obtained test board was observed using an X-ray inspection machine ("NLX-5000", manufactured by NAGOYA ELECTRIC WORKS CO., LTD.). Then, a void ratio [(void area/land area)×100] in the power transistor after the first reflow process was measured.

Figure 2:
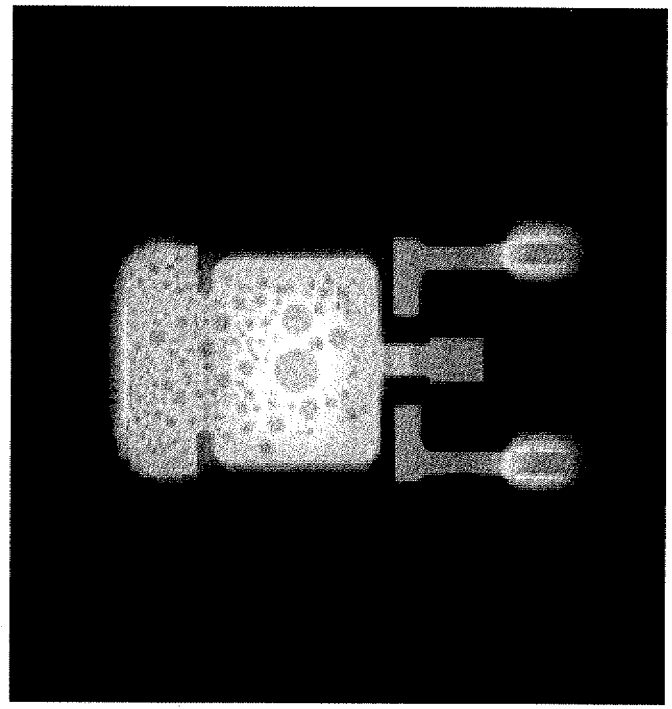
FIG. 2 is a photograph showing an image of a solder-joint portion on a test board of Comparative Example 5 observed using an X-ray inspection machine.
Figure 3:
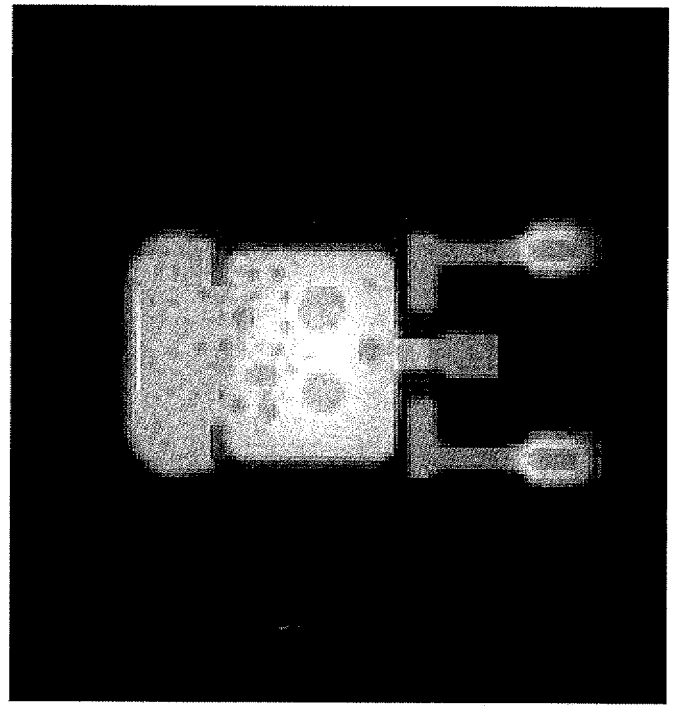
FIG. 3 is a photograph showing an image of a solder-joint portion on a test board of Comparative Example 7 observed using an X-ray inspection machine.

Images of the solder-joint portions observed using the X-ray inspection machine in Example 1 and Comparative Examples 5 and 7 are shown in FIGS. 1, 2 and 3.

Further, the second reflow process was performed on the test board after being subjected to the first reflow process under the same conditions as those of the first reflow process, and the solder-joint portion was observed. Then, a void ratio [(void area/land area)×100] in the power transistor after the second reflow process was measured.

(4) Void on Bump

The solder composition was printed on a board having a plurality of electrode pads of 270 μm diameter using a metal mask having corresponding patterns. Subsequently, a reflow process (in a nitrogen atmosphere, oxygen concentration of 1000 ppm or less) was performed under conditions of 80 seconds of preheating at 150 to 180 degrees C., peak temperature at 240 degrees C. and 40 seconds of melting time to prepare a test board provided with bumps. The bump on the obtained test board was observed using an X-ray inspection machine ("NLX-5000", manufactured by NAGOYA ELECTRIC WORKS CO., LTD.). Each of 500 bumps was checked and the number of bumps having a void whose size was one third or more (i.e. 90 μm or more of diameter) of the diameter of each of the bumps was counted.

TABLE 1

| | | | | Examples | | | | Comparative Examples | | | | | | |
|---|---|---|---|---|---|---|---|---|---|---|---|---|---|---|
| | | | | 1 | 2 | 3 | 4 | 1 | 2 | 3 | 4 | 5 | 6 | 7 |
| Composition of flux composition (mass %) | (A) | | Rosin resin | 42.0 | 42.0 | 42.0 | 42.0 | 42.0 | 42.0 | 42.0 | 42.0 | 42.0 | 42.0 | 42.0 |
| | (B) | | Activator A | 2.1 | 2.1 | 2.1 | 2.1 | 2.1 | 2.1 | 2.1 | 2.1 | 2.1 | 2.1 | 2.1 |
| | | | Activator B | 2.0 | 2.0 | 2.0 | 2.0 | 2.0 | 2.0 | 2.0 | 2.0 | 2.0 | 2.0 | 2.0 |
| | (D) | | Thixotropic agent | 12.0 | 12.0 | 12.0 | 12.0 | 12.0 | 12.0 | 12.0 | 12.0 | 12.0 | 12.0 | 12.0 |
| | (C) | (C1) | Solvent A | 13.0 | 13.0 | 13.0 | 13.0 | 9.0 | 17.0 | 13.0 | 13.0 | 13.0 | 13.0 | 13.0 |
| | | (C2) | Solvent B | 8.0 | — | — | 8.0 | — | — | — | — | — | — | — |
| | | | Solvent C | — | 8.0 | — | — | — | — | — | — | — | — | — |
| | | | Solvent D | — | — | 8.0 | — | — | — | — | — | — | — | — |
| | | (C3) | Solvent E | 20.9 | 20.9 | 20.9 | — | 24.9 | 16.9 | 20.9 | 20.9 | 20.9 | 20.9 | 20.9 |
| | | | Solvent F | — | — | — | — | — | — | — | 8.0 | — | — | — |
| | | | Solvent G | — | — | — | — | — | — | — | — | 8.0 | — | — |
| | | | Solvent H | — | — | — | 20.9 | — | — | — | — | — | 8.0 | — |
| | | (C4) | Solvent I | — | — | — | — | 8.0 | 8.0 | 8.0 | — | — | — | — |
| | | | Solvent J | — | — | — | — | — | — | — | — | — | — | 8.0 |
| | | | Flux composition Total | 100 | 100 | 100 | 100 | 100 | 100 | 100 | 100 | 100 | 100 | 100 |
| Composition of Solder Composition | | | Flux composition | 10.2 | 10.2 | 10.2 | 10.2 | 10.2 | 10.2 | 10.2 | 10.2 | 10.2 | 10.2 | 10.2 |
| | | | (E) Solder powder | 89.8 | 89.8 | 89.8 | 89.8 | 89.8 | 89.8 | 89.8 | 89.8 | 89.8 | 89.8 | 89.8 |
| (mass %) | | | Solder composition Total | 100 | 100 | 100 | 100 | 100 | 100 | 100 | 100 | 100 | 100 | 100 |
| Evaluation Results | (1) Viscosity (Pa*s) | | | 212 | 226 | 209 | 190 | 231 | 225 | 260 | 236 | 248 | 220 | 238 |
| | (2) Printability | | | A | A | A | A | B | B | B | C | A | A | B |
| | (3) Void ratio on power transistor (%) | | After first reflow | 16.0 | 17.8 | 18.0 | 16.0 | 20.8 | 19.8 | 22.1 | 21.1 | 24.4 | 20.7 | 21.1 |
| | | | After second reflow | 23.5 | 24.0 | 24.2 | 19.8 | 28.0 | 27.2 | 30.0 | 27.0 | 31.0 | 26.5 | 27.0 |
| | (4) Number of voids on bump | | | 0 | 0 | 0 | 0 | 0 | 0 | 0 | 0 | 0 | 0 | 0 |

As is clear from the results shown in Table 1, it is confirmed that the viscosity and printability are excellent, the void ratio on a power transistor is low and no large-diameter void is generated on bumps with the use of the solder composition (Examples 1-4) of the exemplary embodiment containing the components (C1) and (C2). Accordingly, it is confirmed that the solder composition of the exemplary embodiment can sufficiently restrain the generation of large-diameter voids and exhibits sufficient printability even when the solder composition is printed over a large print area.

In contrast, when the solder compositions (Comparative Examples 1 to 7) without containing one of the components (C1) and (C2) is used, it is found that the void ratio in a power transistor becomes high.

Further, it is found that the void ratio in a power transistor after the second reflow process can be lowered as compared to Examples 1 to 3 when the solder composition (Example 4) containing the components (C1) and (C2) and the component (C3) (tetraethylene glycol dimethyl ether) (boiling point: 275 degrees C., viscosity: 3.8 mPa·s) is used. In view of the above, it is found that the size increase of the voids caused by a plurality of times of reflow processes can be restrained.

Further, images of the solder-joint portions in Example 1 and Comparative Examples 5 and 7 observed using the X-ray inspection machine are compared (see FIGS. 1 to 3). Though a huge void is observed on test pieces of Comparative Examples 5 and 7, no huge void is observed on the test piece of Example 1.

What is claimed is:

1. A solder composition comprising:
a flux composition comprising a component (A) in a form of a rosin-based resin, a component (B) in a form of an activator, a component (C) in a form of a solvent and a component (D) in a form of a thixotropic agent; and
a component (E) in a form of a solder powder, wherein
the component (C) in a form of the solvent comprises a component (C1) in a form of isobornyl cyclohexanol, a component (C2) in a form of a solvent whose viscosity at 20 degrees C. is 10 mPa·s or less and whose boiling point ranges from 220 degrees C. to 245 degrees C. and a component (C3) in a form of a solvent whose viscosity at 20 degrees C. is 10 mPa·s or less and whose boiling point ranges from 255 degrees C. to 300 degrees C.,
the component (C2) is at least one selected from the group consisting of tripropyleneglycol monomethylether, dipropylene glycol monobutylether and ethyleneglycol mono-2-ethylhexyl ether,
the component (C3) is at least one selected from the group consisting of diethyleneglycol mono-2-ethylhexyl ether, benzylglycol, diethyleneglycol monohexylether and tetraethylene glycol dimethyl ether,
a mass ratio ((C2)/(C1)) of the component (C2) to the component (C1) is in a range from 1/2 to 1, and
a mass ratio ((C3)/(C1)) of the component (C3) to the component (C1) is in a range from 1/2 to 2.

2. An electronic board comprising a soldered portion using the solder composition according to claim 1.

3. The solder composition according to claim 1, wherein a content of the component (A) is in a range from 25 mass % to 60 mass % with respect to 100 mass % of the flux composition.

* * * * *